(12) United States Patent
Wu et al.

(10) Patent No.: US 10,304,889 B2
(45) Date of Patent: May 28, 2019

(54) IMAGE SENSOR DEVICE AND MANUFACTURING METHOD THEREOF

(71) Applicant: TAIWAN SEMICONDUCTOR MANUFACTURING COMPANY LTD., Hsinchu (TW)

(72) Inventors: Wei Chuang Wu, Tainan (TW); Ming-Tsong Wang, Taipei (TW); Feng-Chi Hung, Hsin-Chu County (TW); Jen-Cheng Liu, Hsin-Chu (TW); Ching-Chun Wang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 7 days.

(21) Appl. No.: 15/618,059

(22) Filed: Jun. 8, 2017

(65) Prior Publication Data

US 2018/0240835 A1 Aug. 23, 2018

Related U.S. Application Data

(60) Provisional application No. 62/460,393, filed on Feb. 17, 2017.

(51) Int. Cl.
*H01L 27/146* (2006.01)

(52) U.S. Cl.
CPC .... *H01L 27/14636* (2013.01); *H01L 27/1469* (2013.01); *H01L 27/14634* (2013.01); *H01L 27/14685* (2013.01); *H01L 27/14623* (2013.01)

(58) Field of Classification Search
None
See application file for complete search history.

(56) References Cited

U.S. PATENT DOCUMENTS

| | | | |
|---|---|---|---|
| 2015/0333093 A1* | 11/2015 | Ting | H01L 27/1464 257/432 |
| 2016/0020170 A1* | 1/2016 | Ho | H01L 25/50 257/774 |
| 2016/0300962 A1* | 10/2016 | Borthakur | H01L 27/14621 |

* cited by examiner

*Primary Examiner* — Eric A. Ward
(74) *Attorney, Agent, or Firm* — WPAT, P.C., Intellectual Property Attorneys; Anthony King

(57) ABSTRACT

The present disclosure provides a method of manufacturing an image sensor device. The method comprises forming a first semiconductor chip including a matrix of image sensing cells and bonding a second semiconductor chip with the first semiconductor chip. A plurality of conductive vias are formed in the second semiconductor chip, where each of the plurality of conductive vias includes a first end substantially coplanar with a first surface of the first semiconductor chip and a second end in contact with a conductive trace in the second semiconductor chip. A first dielectric layer is formed over the plurality of conductive vias and a first conductive material is formed over the first dielectric layer. The first conductive material is etched to form a plurality of conductors coupled to ground and the plurality of conductors are electrically isolated from one another.

20 Claims, 16 Drawing Sheets

IMAGE SENSOR DEVICE AND MANUFACTURING METHOD THEREOF

PRIORITY CLAIM AND CROSS-REFERENCE

This application claims priority to U.S. patent application Ser. No. 62/460,393 filed 2017 Feb. 17, the disclosure of which is hereby incorporated by reference in its entirety.

BACKGROUND

As technologies evolve, complementary metal-oxide semiconductor (CMOS) image sensors are attracting more attention due to performance advantages. For example, CMOS image sensors can provide higher image acquisition rates, lower operating voltages, lower power consumption and greater noise immunity. A CMOS image sensor usually comprises an array of light-sensing elements or pixels. Each of the pixels is configured to convert received photons into electrons. Additionally, the CMOS image sensor comprises circuitry to transform the electrons into electrical signals. The electrical signals are then processed to generate an image of a subject scene.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
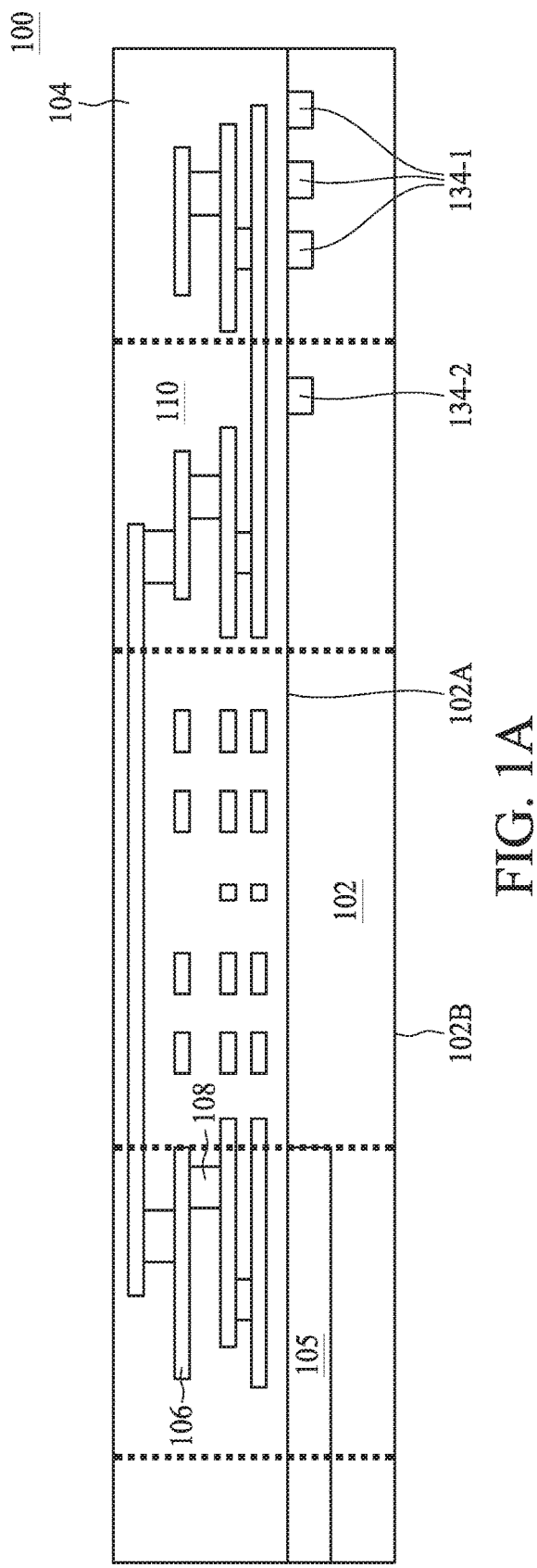
FIGS. 1A through 1O are cross-sectional views of intermediate structures for a method of manufacturing an image sensor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides structures and manufacturing operations of image sensor devices according to various embodiments. In manufacturing modern image sensor devices, elements and circuitries for performing different tasks, such as photo sensing, photo-electrical signal transformation and signal processing, may be initially fabricated on two different substrates (or chips) and the two substrates are then bonded. Additionally, conductive plugs or conductive vias are proposed to electrically couple the two bonded substrates. In some cases those conductive vias run through an oxide layer or dielectric layer between the two boded substrate and may be referred to as a "through oxide via." The through oxide vias may be protected by an overlaying capping layer. Specifically, the capping layer is formed as an array of capping pads, which are electrically isolated from each other. The electrical performance of the through oxide via can be enhanced due to the improved configuration of the capping layer.

FIGS. 1A through 1P are cross-sectional views of intermediate structures for a method of manufacturing an image sensor device 10, in accordance with some embodiments.

Referring to FIG. 1A, a first semiconductor chip 100 is formed. In some embodiments, the first semiconductor chip 100 is configured to carry out tasks related to image sensing. The first semiconductor chip 100 includes a first substrate 102 and a first interconnect layer 104 over the first substrate 102.

Initially, the first substrate 102 is received or provided. The first substrate 102 includes a semiconductor material such as silicon. In some embodiments, the first substrate 102 may include other semiconductor materials, such as silicon germanium, silicon carbide, gallium arsenide, or the like. In some embodiments, the first substrate 102 is a p-type semiconductive substrate (acceptor type) or an n-type semiconductive substrate (donor type). Alternatively, the first substrate 102 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In yet another embodiment, the first substrate 102 is a semiconductor-on-insulator (SOI) substrate. In other alternatives, the first substrate 102 may include a doped epitaxial layer, a gradient semiconductor layer, or a semiconductor layer overlaying another semiconductor layer of a different type, such as a silicon layer on a silicon germanium layer.

In some embodiments, several image sensing regions 134 are formed on a front surface 102A of the first substrate 102. In some embodiments, the image sensing regions 134 (a.k.a. sensing cells or sensing pixels) are arranged in a form of matrix or an array. The image sensing regions 134 may include an active image sensing region 134-1 and a reference image sensing region 134-2. The active image sensing regions 134-1 are configured to perform photo sensing and receive radiation or light from a back surface 102B of the first substrate 102, while the reference image sensing region 134-2 is blocked from receiving radiation or light in order to provide a reference level for sensing. In some embodiments, the active image sensing regions 134-1 may be disposed in a specific area spaced from other areas where light or radiation can impinge into such area with a high efficiency. In some embodiments, a blocking layer (not shown) may be disposed over the reference image sensing region 134-2 to keep the reference sensing region 134-2 in a "dark" state. The image sensing regions 134 (including regions 134-1 and 134-2) may include doped regions with n-type or p-type dopants in the first substrate 102. In some embodiments, the image sensing regions 134 may be formed of photo-sensing elements such as a photodiode, pinned layer photodiode, non-pinned layer photodiodes, and auxiliary circuits such as a reset transistor, a source follower transistor, a transfer transistor, a select transistor, or the like.

In some embodiments, a portion of the front surface 102A of the first substrate 102 is recessed to a predetermined depth. A dielectric layer 105 is then formed on the first substrate 102 and may fill the recessed portion. A planarization operation may be performed to level the dielectric layer 105 with the front surface 102A. The dielectric layer 105 may be used for formation of other features, such as a bonding pad that will be described later. In some embodiments, the dielectric layer 105 is formed of a dielectric material, such as silicon oxide, silicon nitride, or the like.

Next, the first interconnect layer 104 is formed over the first substrate 102 and the dielectric layer 105. The first interconnect layer 104 is configured to electrically couple the components in the first substrate 102 with external devices, such as another semiconductor chip. In some cases, the first interconnect layer 104 may redistribute the layout of connections between the first semiconductor chip 100 and electrically coupled devices in order to facilitate signal transmission, and thus is also termed a "redistribution layer (RDL)." The first interconnect layer 104 may include layered conductive lines 106. The conductive lines 106 in each layer extend along a horizontal direction and are interconnected through adjacent vertical conductive vias or contacts 108. The conductive lines 106 and conductive vias/contacts 108 may be formed of conductive materials, such as copper, tungsten, aluminum, silver, combinations thereof, or the like. The number of layers for conductive lines 106 or conductive vias/contacts 108 can be configured in adaptation to different applications as desired.

In addition, the conductive lines 106 and conductive vias/contacts 108 are encapsulated and electrically insulated. The encapsulation and insulation may be achieved by insulating materials. In some embodiments, the remaining portion of the first interconnect layer 104 may be formed of a dielectric material or inter-metal dielectric (IMD) 110. The dielectric material 110 may be formed of oxides, such as un-doped Silicate Glass (USG), Fluorinated Silicate Glass (FSG), or other suitable dielectric materials. In some embodiments, the first interconnect layer 104 comprises bond pads which are exposed through the dielectric material 110 and serve as bonding ports.

The first interconnect layer 104 may be formed through suitable semiconductor manufacturing methods, such as lithographic operation, etching, chemical vapor deposition (CVD), physical vapor deposition (PVD), plating, or the like. In some embodiments, one layer of the first interconnect layer 104 may be formed by initially forming a seed layer (not shown) through a suitable method such as a deposition operation or sputtering. Next, a photoresist (also not shown) may then be formed over the seed layer, and the photoresist may then be patterned to expose portions of the seed layer where the conductive lines 106 or conductive vias 108 are formed thereon. Once the photoresist has been patterned, a conductive material may be formed on the seed layer through a deposition operation, such as plating, and one layer of conductive lines or vias is thus completed. More layers may be formed repeatedly on the as-formed layer as desired.

Figure 1B:
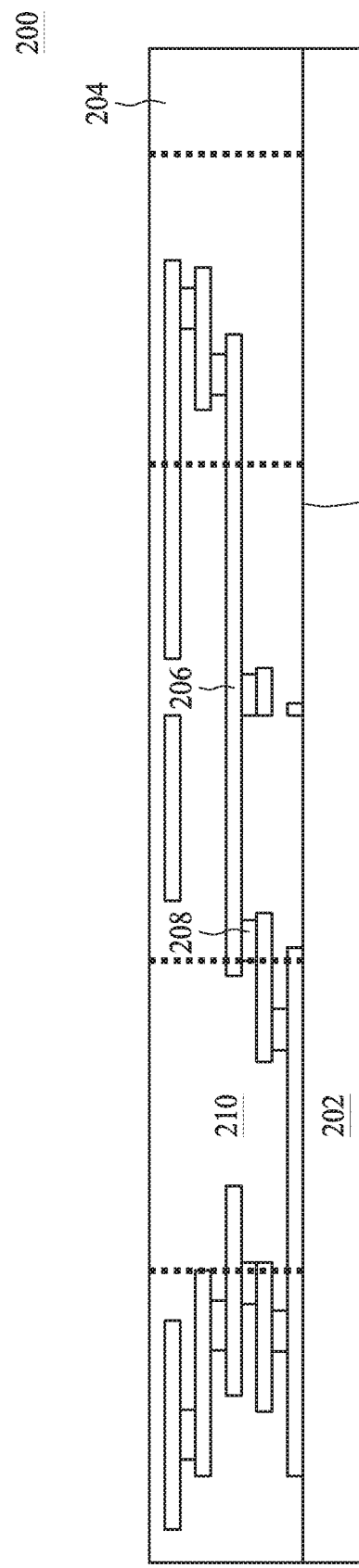

Referring to FIG. 1B, a second semiconductor chip 200 is formed. In some embodiments, the second semiconductor chip 200 is configured to perform specific tasks related to reception, processing, or transmission of electrical signals. In some embodiments, the second semiconductor chip 200 is configured as an application-specific integrated circuit (ASIC) chip. The second semiconductor chip 200 includes a second substrate 202 and a second interconnect layer 204 over the second substrate 202.

The second substrate 202 includes a semiconductor material such as silicon. In some embodiments, the second substrate 202 may include other semiconductor materials, such as silicon germanium, silicon carbide, gallium arsenide, or the like. In some embodiments, the second substrate 202 is a p-type semiconductive substrate (acceptor type) or an n-type semiconductive substrate (donor type). Alternatively, the second substrate 202 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In yet another embodiment, the second substrate 202 includes a structure and material similar to those of the first substrate 102.

In some embodiments, the second semiconductor chip 200 includes semiconductor components (not shown) formed on a front surface 202A. The semiconductor components may include doped regions, conductive features, and dielectric materials. In some embodiments, such semiconductor components are configured to form passive elements, such as a capacitor, an inductor, a diode, combinations thereof, or the like. In some embodiments, the components are arranged to form active circuitries such as bipolar junction transistors, field effect transistors, or the like.

The second interconnect layer 204 is formed over the second substrate 202. The second interconnect layer 204 is configured to electrically couple the components of the second substrate 202 with overlaying devices, such as the first semiconductor chip 100. In some embodiments, the second interconnect layer 204 may be arranged in a manner similar to that of the first interconnect layer 104 and may include layered conductive lines 206 and vertical conductive vias/contacts 208. The conductive lines 206 and conductive vias/contacts 208 may be formed of conductive materials, such as copper, tungsten, aluminum, silver, combinations thereof, or the like. The number of conductive lines 206 and conductive vias/contacts 208 can be configured to adapt to different applications. In some embodiments, the second interconnect layer 204 further comprises bond pads (not shown) in an outermost layer to electrically bond with external features.

The conductive lines 206 or the conductive vias/contacts 208 are encapsulated with a dielectric material 210. The dielectric material (e.g., IMD) 210 may be formed of oxides, such as un-doped Silicate Glass (USG), Fluorinated Silicate Glass (FSG), or other suitable dielectric materials. In some embodiments, the configuration, material and manufacturing operations of the second interconnect layer 204 may be similar to those of the first interconnect layer 104.

Figure 1C:
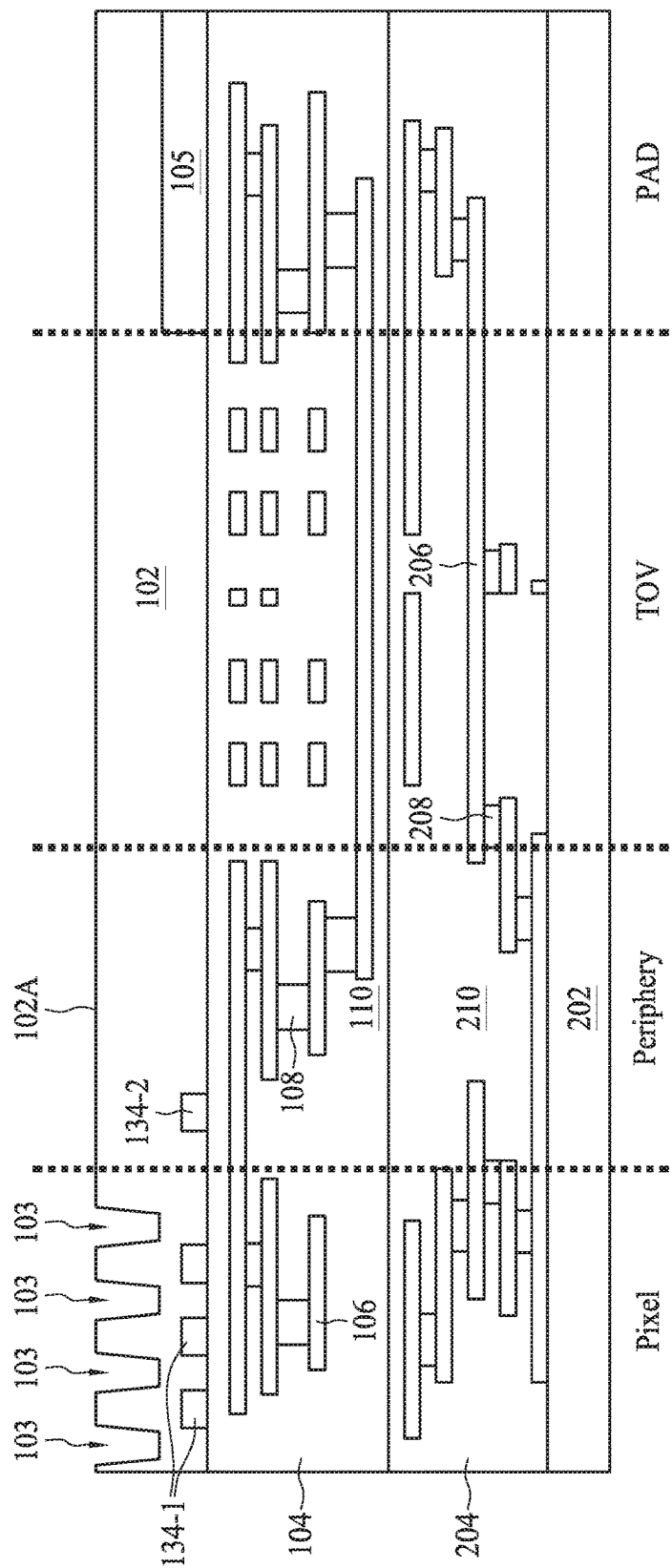

FIG. 1C illustrates a bonding operation of the first semiconductor chip 100 with the second semiconductor chip 200. The image sensor device 10 is formed by flipping the first semiconductor chip 100 and aligning bonding pads of the first interconnect layer 104 with corresponding bonding pads of the second interconnect layer 204. The bonding method may include direct bonding, chemically activated bonding, plasma activated bonding, metal diffusion bonding, eutectic bonding, adhesive bonding, thermo-compressive bonding, reactive bonding, or the like. In some embodiments, the image sensor device 10 may include an adhesive layer or polymer layer (not separately shown) between the first semiconductor chip 100 and the second semiconductor chip 200 to enhance the bonding force.

In the present embodiment, the image sensor device 10 is partitioned virtually into several areas from a top view by different functions or configurations. For example, the active image sensing regions 134-1 are disposed in a first area (called "pixel" area), and the reference image sensing region 134-2 and other auxiliary circuits (such as ground terminals) may be disposed in a second area (called "periphery" area). Furthermore, some specific conductive vias (e.g., the through oxide via) may be formed in a third area (called "TOV" area) and a bonding pad structure may be configured in a fourth area (called "PAD" area). In some embodiments, one or more of the above-mentioned areas may be omitted. The layouts, sizes, and geometries of such areas as illustrated in FIG. 1C are presented as merely one example. Other configurations are also possible. Details of the above-mentioned areas are provided in the following paragraphs.

In some embodiments, the first substrate 102 is thinned or ground to a predetermined depth. In some embodiments, after the thinning operation, the first substrate 102 has a depth of between about 2 μm and about 10 μm. In some embodiments, the thinned first substrate 102 has a depth of between about 3 μm and about 5 μm. Next, several trenches 103 are formed on the front surface 102A of the first substrate 102. In some embodiments, the trenches 103 are formed within the "pixel" area and disposed over the active image sensing regions 134-1 at gaps between the active image sensing regions 134-1.

Figure 1D:
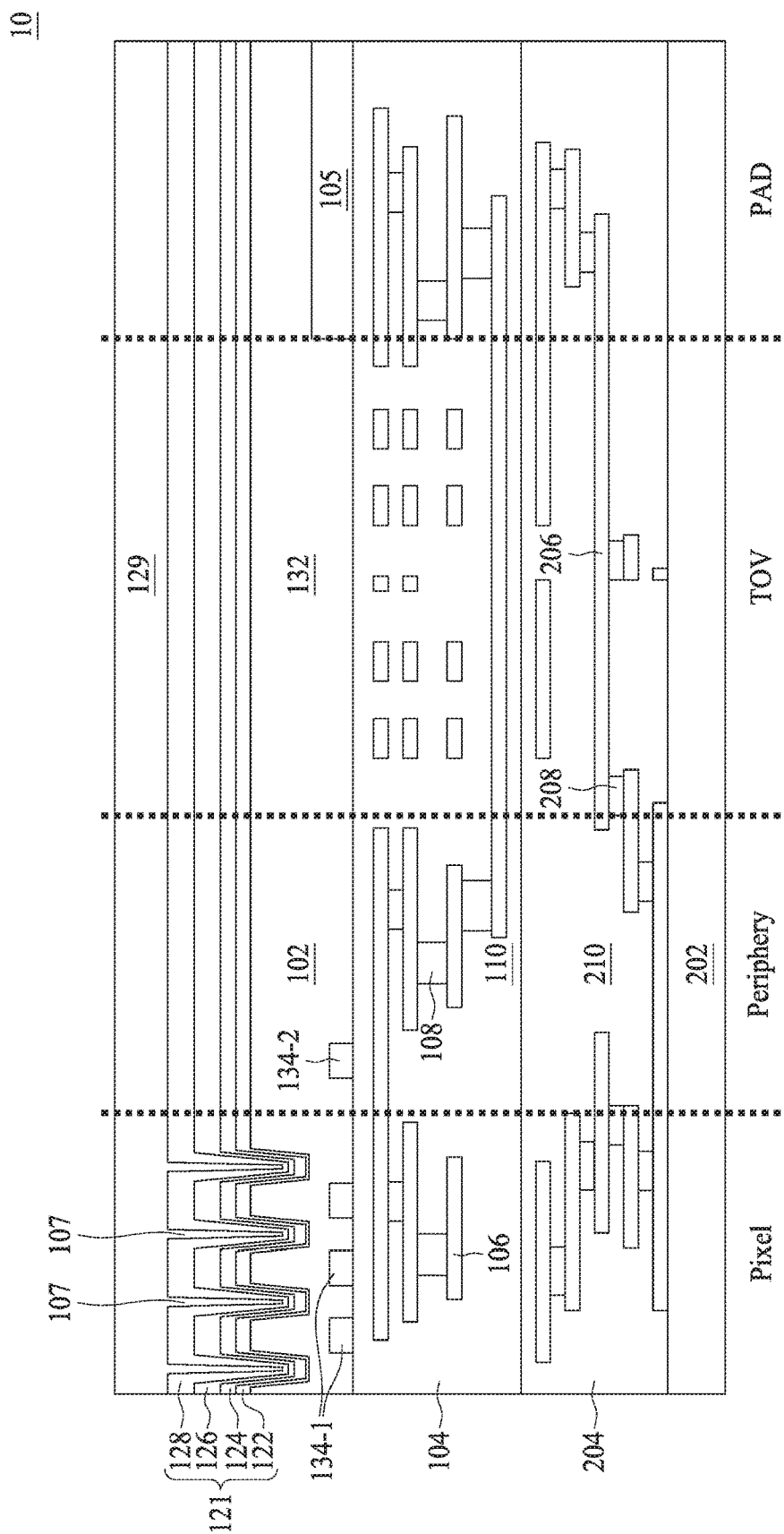

FIG. 1D illustrates a forming of a buffer structure 121 over the first substrate 102. The buffer structure 121 extends over the "TOV" area and the "periphery" area. In some embodiments, the buffer structure 121 is used to protect the image sensor device 10 from external stress or contamination. In some embodiments, the buffer structure 121 is also configured to extend to the "pixel" area and form shield structures 107 over the active image sensing regions 134-1. The shield structures 107 are formed by filling the trenches 103 shown in FIG. 1C and are used to reduce optical crosstalk or noise of photo reception from adjacent image sensing regions 134-1. In some embodiments, the buffer structure 121 includes a layered structure. In the present embodiment, the buffer structure 121 is formed of dielectric layers 122, 124, 126, and 128 to provide better optical performance for the shield structures 107. In some embodiments, the dielectric layers 122, 124, 126, and 128 may be formed of silicon oxide, silicon nitride, silicon oxynitride, or the like. In some embodiments, the dielectric layers 122, 124, 126 and 128 may be formed of $HfO_2$, $ZrO_2$, $La_2O_3$, $Y_2O_3$, $Al_2O_3$, $TiO_2$, $HfSi_xO_y$, $ZrSi_xO_y$, $LaSi_xO_y$, $YSi_xO_y$, $AlSi_xO_y$, $TiSi_xO_y$, or the like. For example, the dielectric layers 122, 124, 126, and 128 are made of silicon oxide, HfO, $Ta_2O_5$, and oxide, respectively. The dielectric layers 122, 124, 126, and 128 may be formed by suitable methods, such as thermal oxidation, CVD, plasma-enhanced CVD (PECVD), or the like.

In embodiments, a conductive layer 129 may be formed over the buffer structure 121 and in the trenches 103.

The application of a conductive material to the shield structures 107 may enhance the light shielding or reflecting capability of the shielding structures 107. The conductive layer 129 may include a conductive material such as Ti, Ta, TiN, TaN, NiSi, CoSi, or the like. The conductive layer 129 may be formed by a deposition operation, e.g., CVD, ALD, PECVD, sputtering, or the like.

Figure 1E:
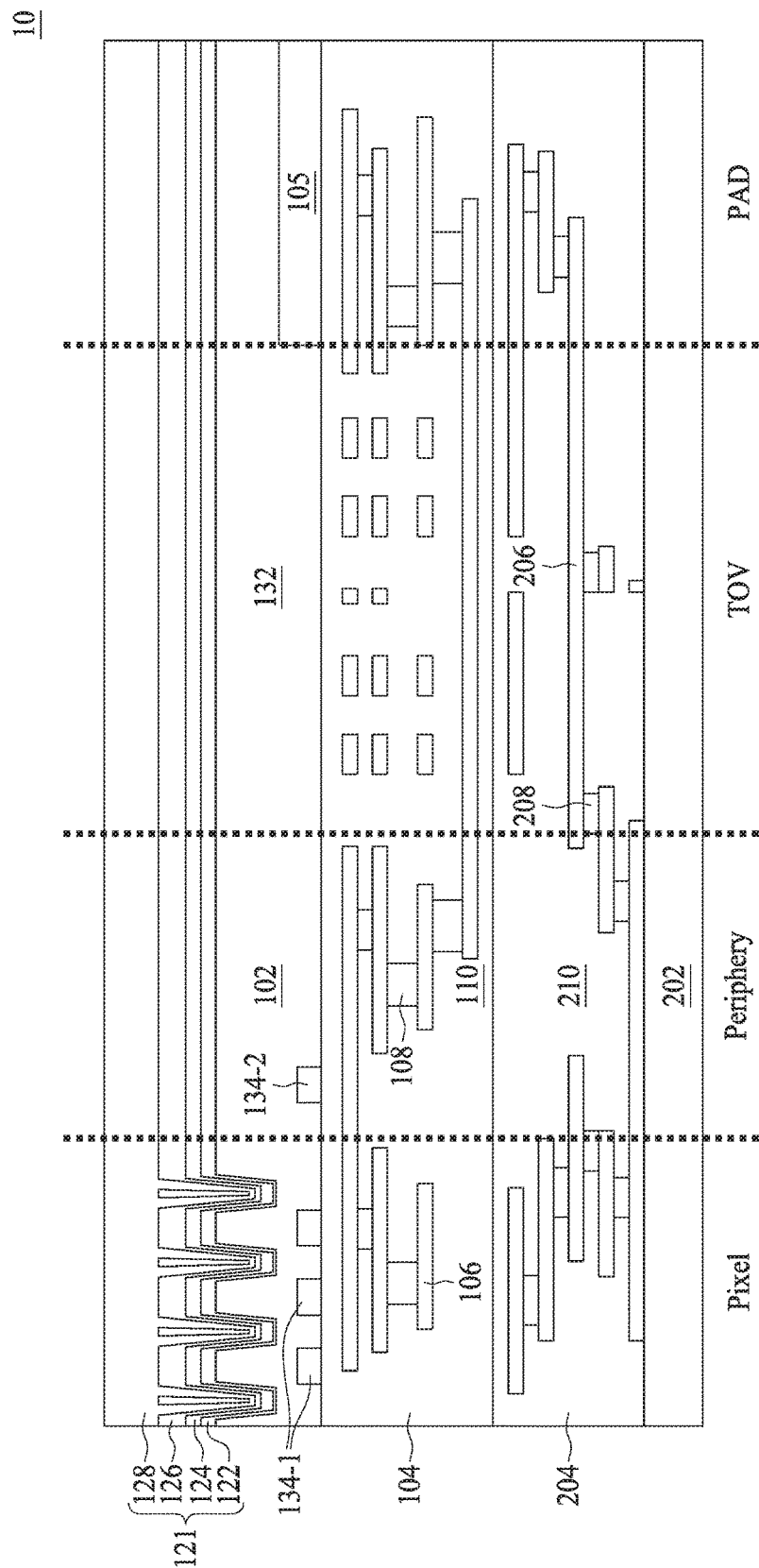

As illustrated in FIG. 1E, a portion of the buffer structure 121 and the conductive layer 129 is removed or thinned. In some embodiments, horizontal portions of the dielectric layer 128 and conductive layer 129 extending over the dielectric layer 126 are removed. However, a vertical portion of the conductive layer 129 extending through the dielectric layers 122, 124, 126 and 128 in the shield structures 107 are retained. As can be seen by comparing FIG. 1D and FIG. 1E, a top of each of the vertical portions of the conductive layer 129 in the shield structure 107 is reduced along with the removal of the horizontal portions of the dielectric layer 128. Subsequently, the dielectric layer 128 is formed again and made thicker than the previous forming by depositing a same material of the dielectric layer 128 onto the thinned buffer structure 121. In some embodiments, the thickened dielectric layer 128 has a thickness of between about 1000 Å and about 1500 Å, e.g., 1200 Å.

Figure 1F:
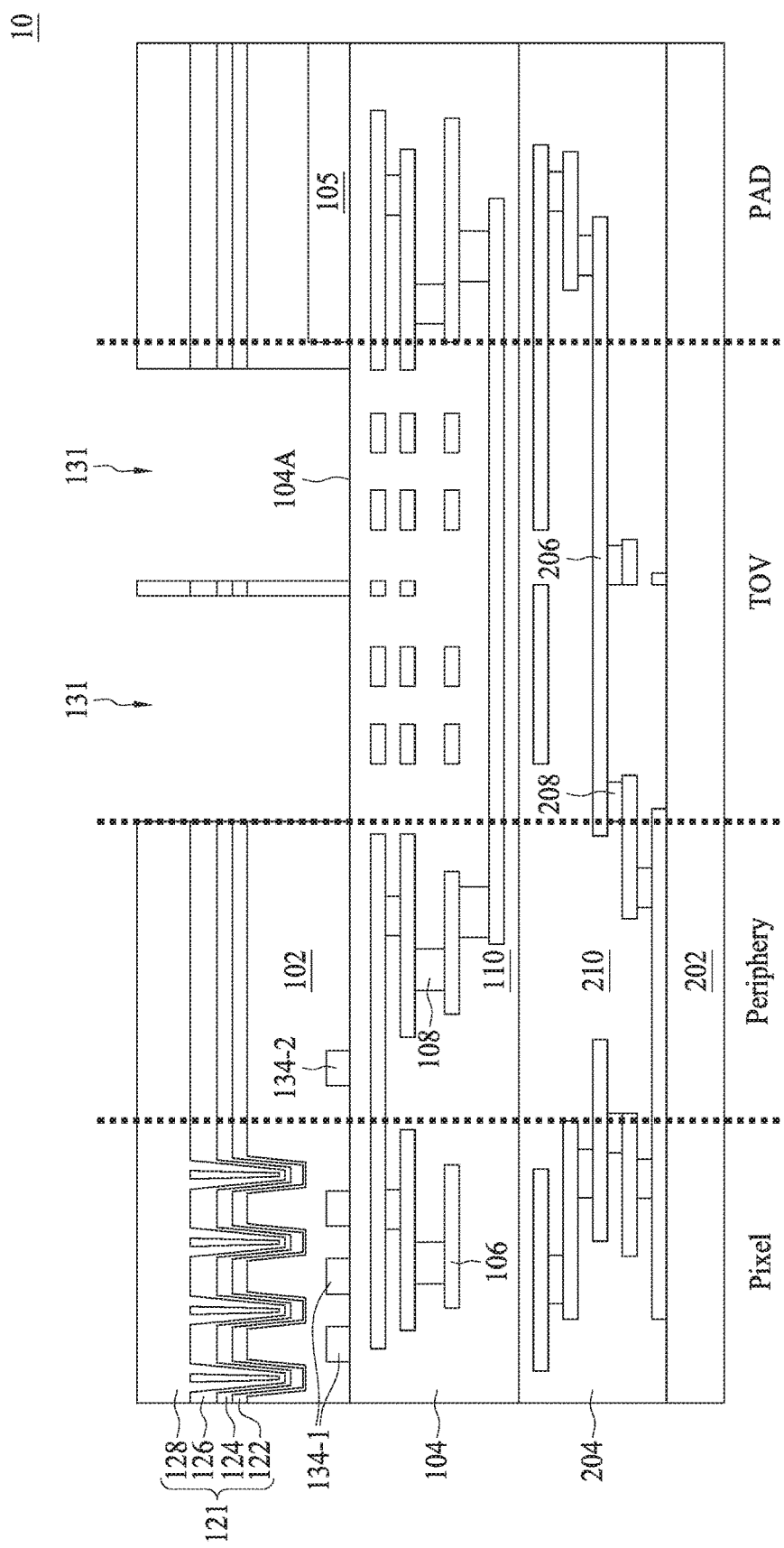

FIG. 1F through FIG. 1J illustrate a forming of the conductive vias or through oxide vias 136. Referring to FIG. 1F, several recesses 131 are formed in the "TOV" area. The recesses 131 are formed from a top surface of the dielectric layer 128. The recesses 131 run through the dielectric layers 126, 124, and 122, and through the first substrate 102. A portion of the upper surface 104A of the first interconnect layer 104 is exposed accordingly. The recesses 131 may be formed by an etching operation, such as a wet etching, a dry etching or a reactive ionic etching (RIE) operation.

Figure 1G:
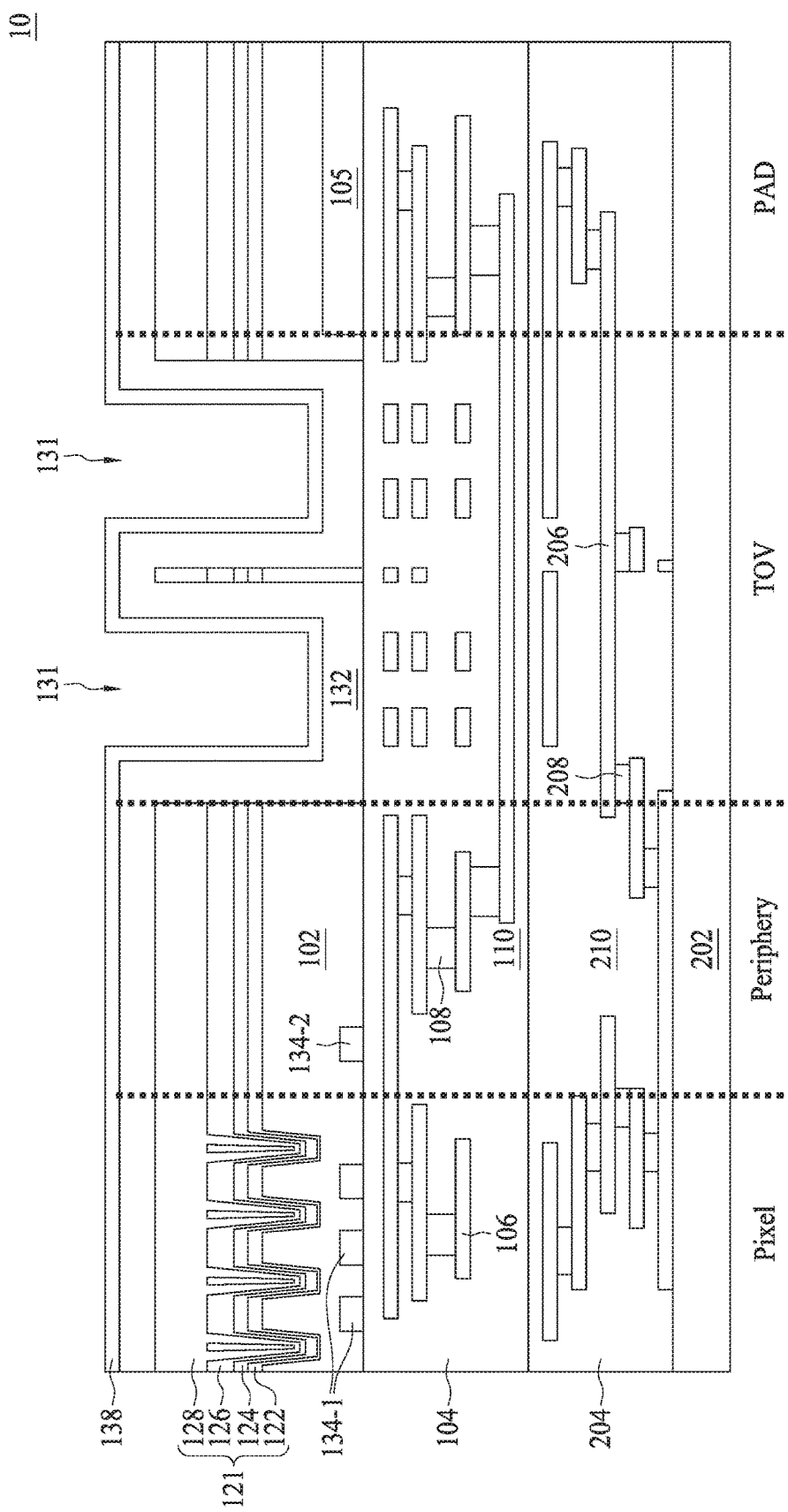

Next, as shown in FIG. 1G, a first buffer layer 132 and a second buffer layer 138 are sequentially conformally formed over the dielectric layer 128 and on sidewalls of the recesses 131. In some embodiments, the buffer layers 132 and 138 may also extend over the "pixel" area, the "periphery" area, and the "PAD" area. The buffer layer 132 or 138 may be used as a diffusion barrier layer for the subsequently-formed conductive material 136. The first buffer layer 132 and the second buffer layer 138 may include dielectric materials, such as silicon oxide, silicon nitride, silicon oxynitride, or the like. In some embodiments, the first buffer layer 132 and the second buffer layer 138 may have different materials and thicknesses. In some embodiments, the first buffer layer 132 includes a low deposited rate resistor protection oxide (LRPO) and the second buffer layer 138 includes a silicon nitride. In some embodiments, the first buffer layer 132 includes a thickness of between about 1500 Å and about 3000 Å, e.g., 2000 Å. In some embodiments, the second buffer layer 132 includes a thickness of between about 200 Å and about 1000 Å, e.g., 500 Å. The first buffer layer 132 and the second buffer layer 138 may be formed through suitable operations such as thermal oxidation, CVD, PECVD, PVD, ALD, or the like.

Figure 1H:
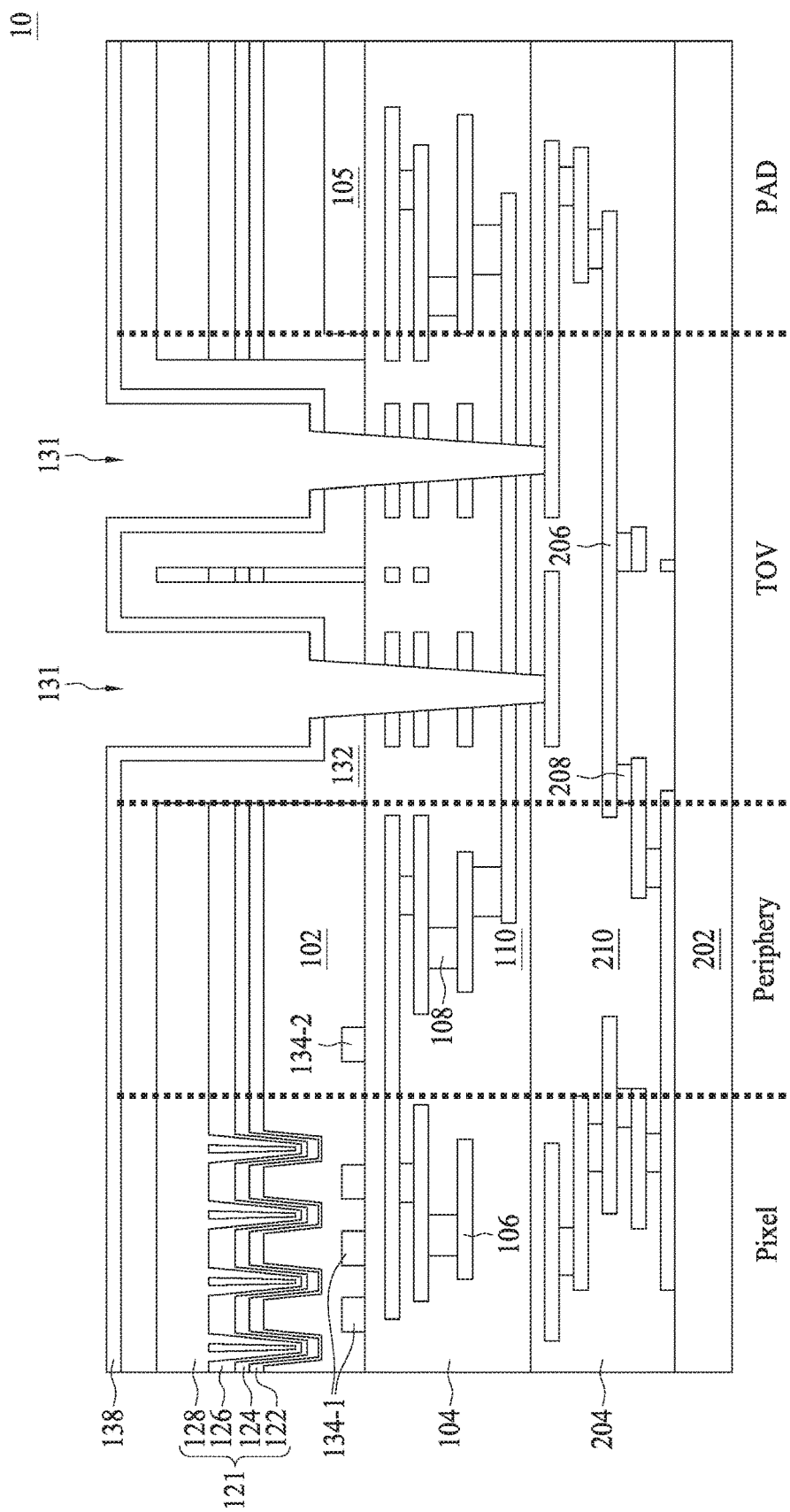

Referring to FIG. 1H, the recesses 131 are extended farther downward. A portion around the bottoms of the first buffer layer 132 and the second buffer layer 138 are removed. The extended recesses 131 run through the first buffer layer 132, the second buffer layer 138 and the first interconnect layer 104. The recesses or vias 131 are sometimes termed "through oxide via" since they pass through the IMD 110. In some embodiments, the extended recesses 131 run in the second interconnect layer 204 and reach at least one of the conductive trace or lines 206. In contrast, other conductive vias in the first interconnect layer 104, such as the conductive vias 108, extend into the IMD 110. Stated differently, the conductive vias 108 have ends within and surrounded by the IMD 110. The extended recesses 301 may be formed using a wet etching, a dry etching or an RIE operation.

Figure 1I:
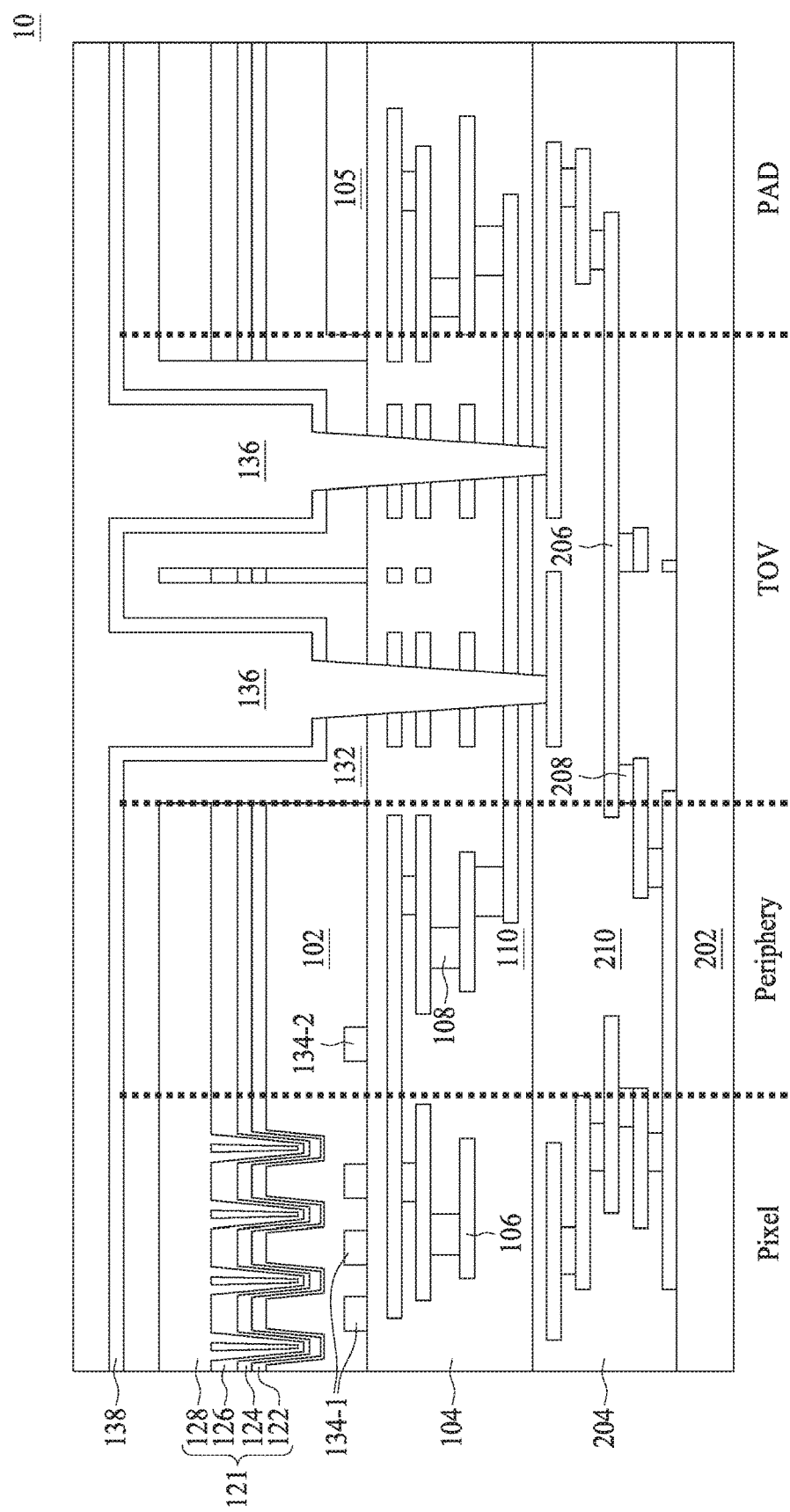

FIG. 1I shows a forming of the conductive vias 136 in the recesses 131. The conductive vias 136 may be formed of a conductive material such as copper, tungsten, aluminum, silver, combinations thereof, or the like. The conductive vias 136 may be formed by CVD, PVD, sputtering, or other suitable methods. The conductive vias 136 may be formed by blanket depositing a conductive material over the image sensor device 10 and into the recesses 131. In some embodiments, the conductive vias 136 physically contact the IMDs 110 and 210 of the first interconnect layer 104 and the second interconnect layer 204, respectively. In some embodiments, the conductive vias 136 electrically connect a conductive line or trace 206 of the second interconnect layer 204. In some embodiments, the conductive vias 136 electrically connect to a conductive line 106 of the first interconnect layer 104.

Figure 1J:
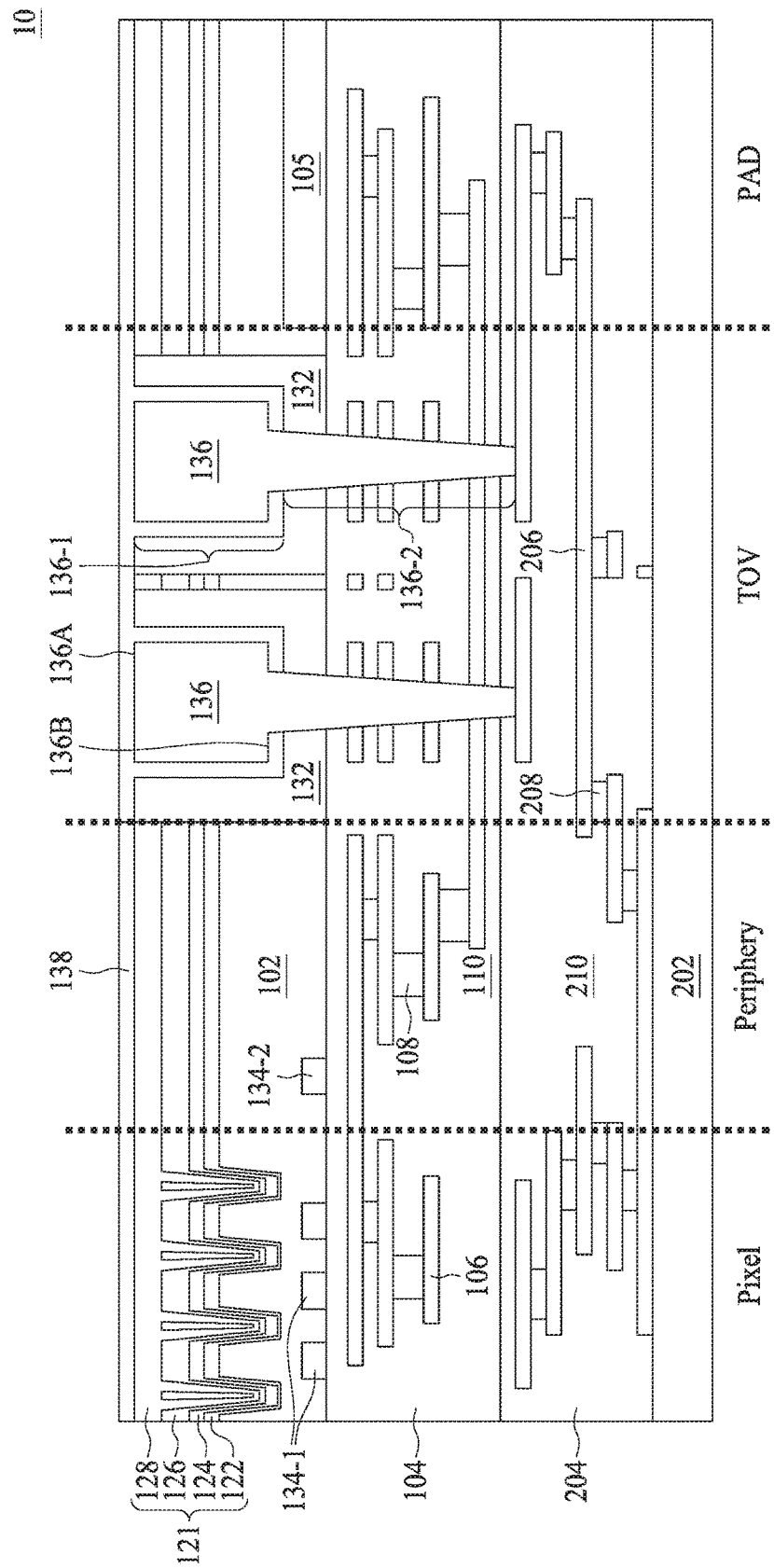

Referring to FIG. 1J, excess portions of the conductive material 136 may be removed by a planarization operation, such as grinding or chemical mechanical polishing (CMP). As such, horizontal portions of the respective conductive material 136 and the buffer layers 132 and 138 are removed as shown in FIG. 1J. In some embodiments, the dielectric layer 128 is also thinned. A dielectric material, which may be, for example, formed of a same material as that of the second buffer layer 138, is deposited over the thinned dielectric layer 128 and an exposed upper surface of each of the conductive vias 136.

Each of the conductive vias or recesses 136 is comprised of a first portion 136-1 and a second portion 136-2 below the first portion 136-1. In the present embodiment, the first portion 136-1 is situated in the first substrate 102 while the second portion 136-2 may extend from the first substrate 102, through the IMD 110, and stop in the IMD 210. In some embodiments, the first portion 136-1 has a width that remains substantially equal from an upper surface 136A to a bottom surface 136B of the first portion 136-1. In some embodiments, the first portion 136-1 has a width greater than a second width of the second portion 136-2. In some embodiments, the second portion 136-2 has a tapered sidewall.

In some embodiments, the first portion 136-1 is surrounded by the first buffer layer 132 and the second buffer layer 138. In addition, the first portion 136-1 may be covered by the second buffer layer 138. In the present embodiment, the first portion 136-1 is coplanar with the dielectric layer 128 and a top portion of the second buffer layer 132. In some embodiments, the second portion 136-2 contacts the IMD 110 or 210 without other dielectric materials therebetween. In some embodiments, the first buffer layer 132 extends below the bottom surface 136B of the first portion 136-2. In some embodiments, the first buffer layer 132 laterally surrounds a top of the second portion 136-2.

In some embodiments, the upper surface 136A of each of the conductive vias 136 has a width greater than about 3.5 µm. In some embodiments, each of the upper surfaces 136A has a width of between about 3.5 µm and about 5.0 µm. In some embodiments, each of the upper surfaces 136A has an area greater than about 12 µm². In some embodiments, each of the upper surfaces 136A has an area of between about 12 µm² and about 25 µm². In some embodiments, a ratio between a width of the upper surface 136A of each of the conductive vias 136 and a width of the conductive via 108 or 208 is greater than about 2. In some embodiments, a ratio between a width of the upper surface 136A of each of the conductive vias 136 and a width of the conductive via 108 or 208 is about 2.0 to about 4.0.

Figure 1K:
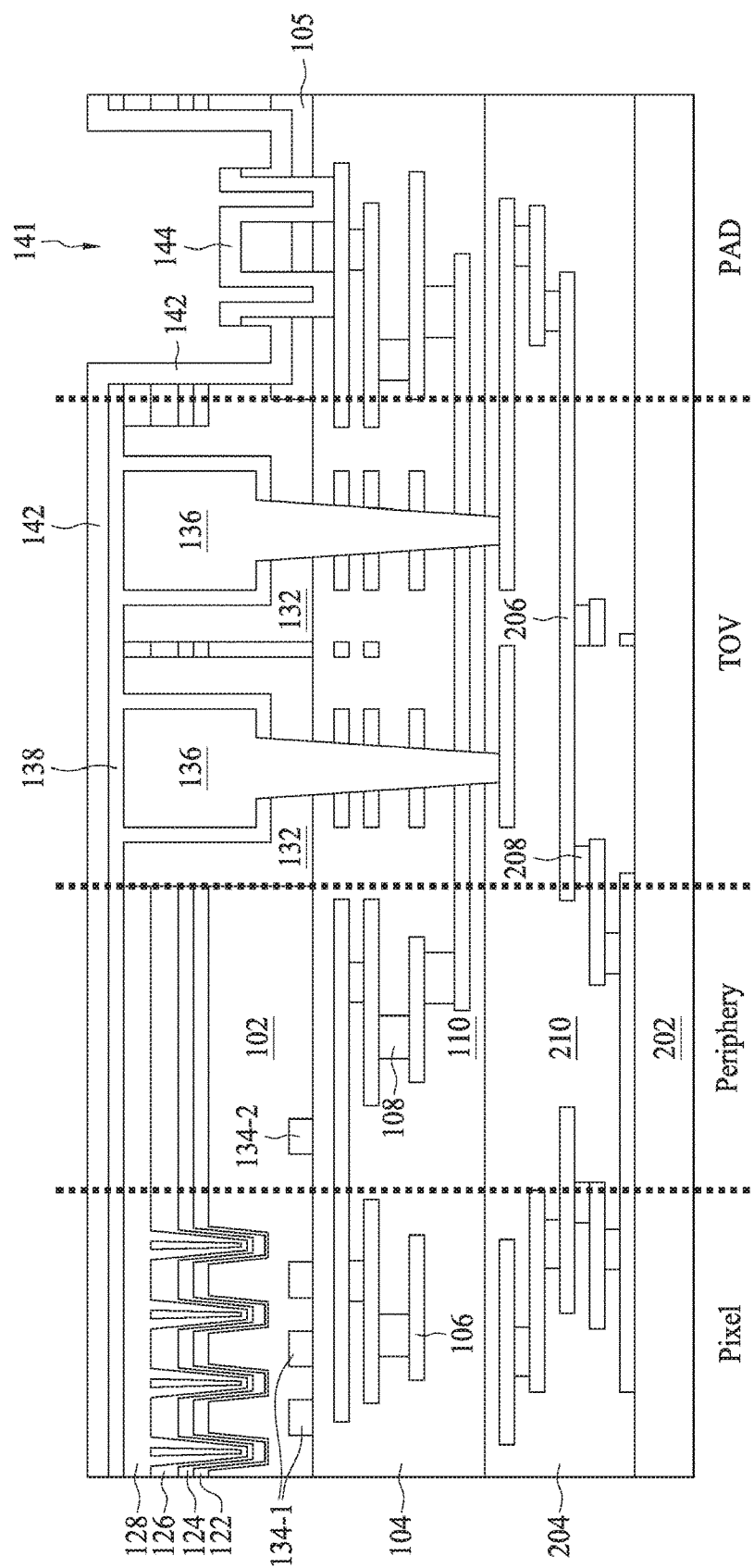
Figure 1L:
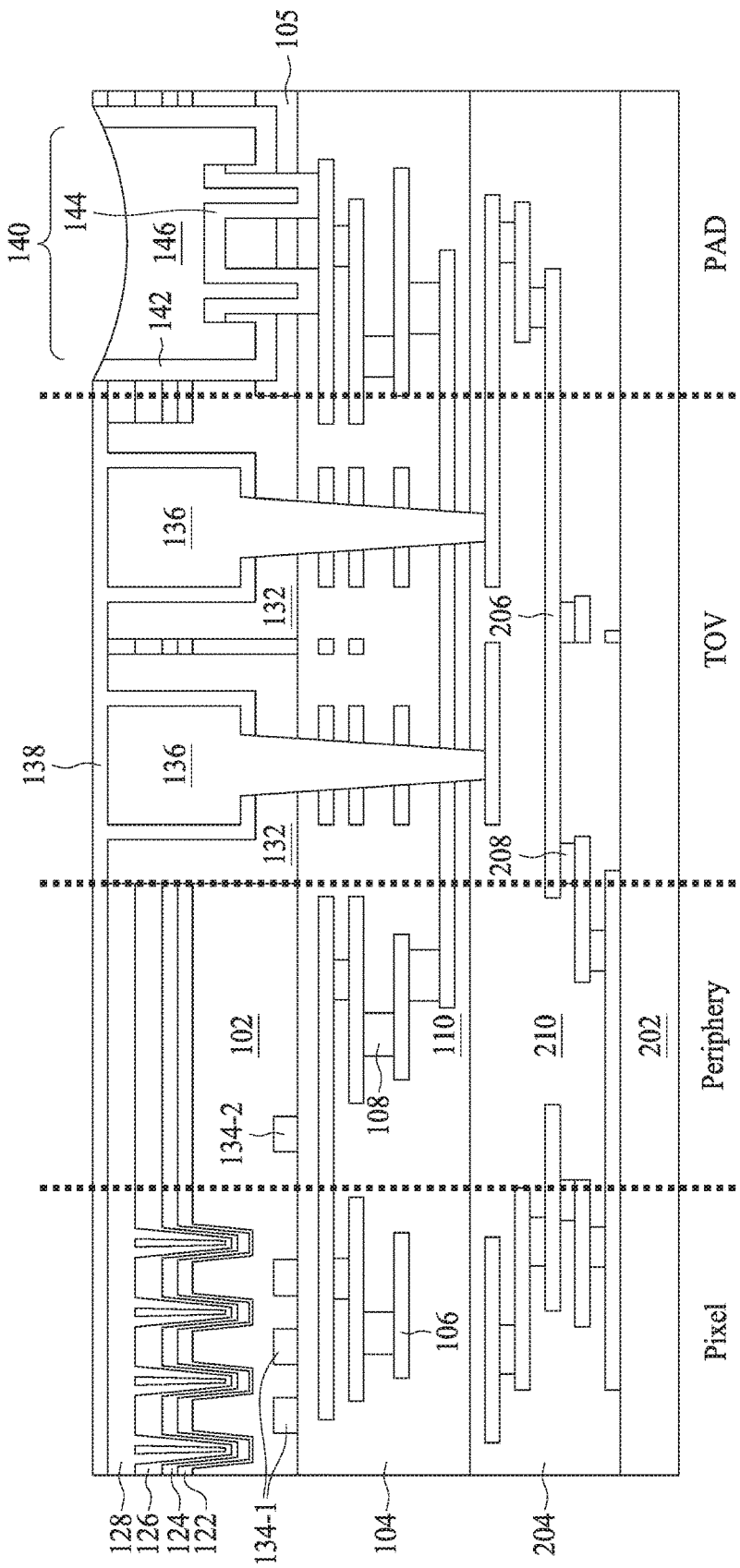

FIGS. 1K and 1L illustrate a forming of a bond pad structure 140. In some embodiments, the bond pad structure 140 is configured to electrically couple the second interconnect layer 204 with external devices. Initially, as shown in FIG. 1K, a recess 141 is formed over the dielectric layer 105 in the "PAD" area. The recess 141 may be formed over the dielectric layer 105 through an etching operation with a patterned mask layer (e.g., a photoresist layer) as the etch mask. The etching operation may include a wet etching operation, a dry etching operation, or an RIE operation. In some embodiments, the etch removes portions of the second buffer layer 138, the dielectric layers 122, 124, 126 and 128, and an entire thickness of the first substrate 102 above the dielectric layer 105. In some embodiments, a thickness of the dielectric layer 105 is also reduced during the recessing operation. A second dielectric layer 142 is conformally deposited over the first substrate 102, and deposited onto sidewalls and a bottom of the recess 141. The second dielectric layer 142 may be formed of silicon oxide, silicon nitride, silicon oxynitride, or the like. Next, one or more trenches is formed in the bottom of the recess 141 where the trenches extend from an upper surface of the second dielectric layer 142 to the second interconnect layer 204. At least one conductive line 106 or conductive via 108 is exposed to the trenches. Subsequently, a bond pad 144 is formed in the trench. The bond pad 144 may include a conductive material such as copper, aluminum, tungsten, silver, combinations thereof, or the like. The conductive pad 144 may be formed by conformally depositing a conductive material over the second dielectric layer 142 followed by a patterning operation that removes undesired portions of the conductive material.

In FIG. 1L, a third dielectric layer 144 is formed to cover the exposed second dielectric layer 142. The third dielectric layer also fills the recess 141. Next, a planarization operation is performed to remove recess materials of the third dielectric layer 144 and horizontal portions over the areas other than the "PAD" area. The bonding structure 140 is completed accordingly.

Figure 1M:
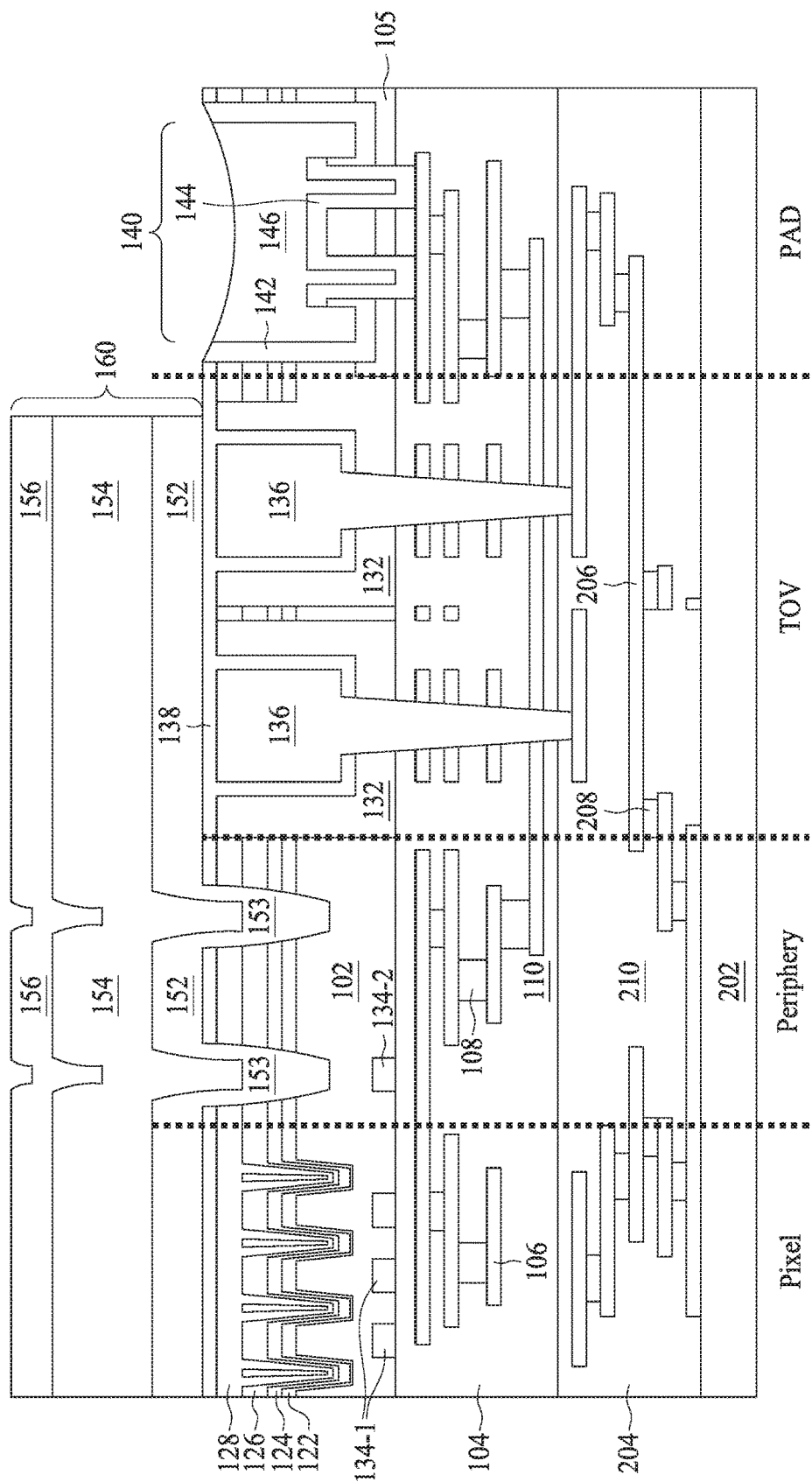
Figure 1N:
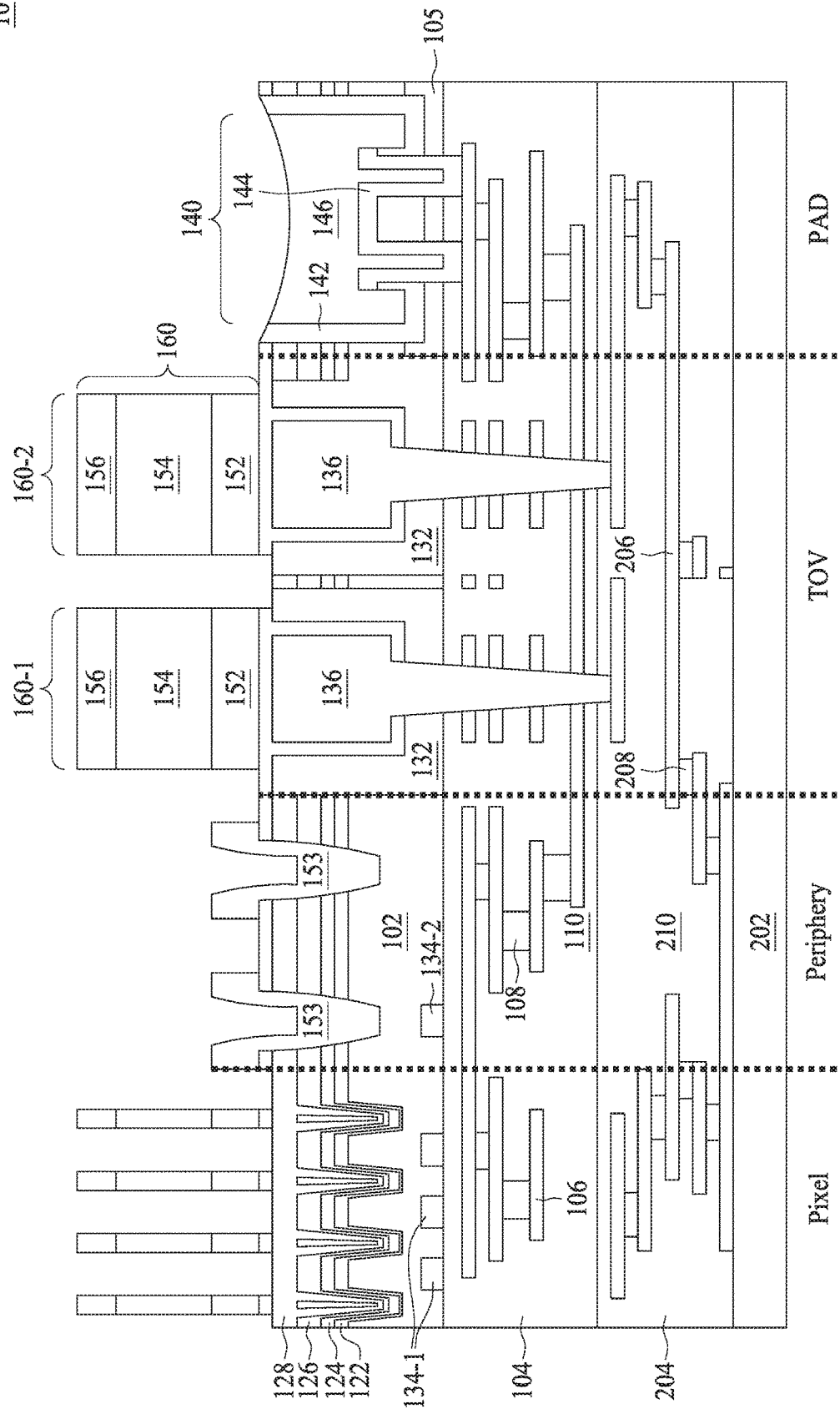
Figure 10:
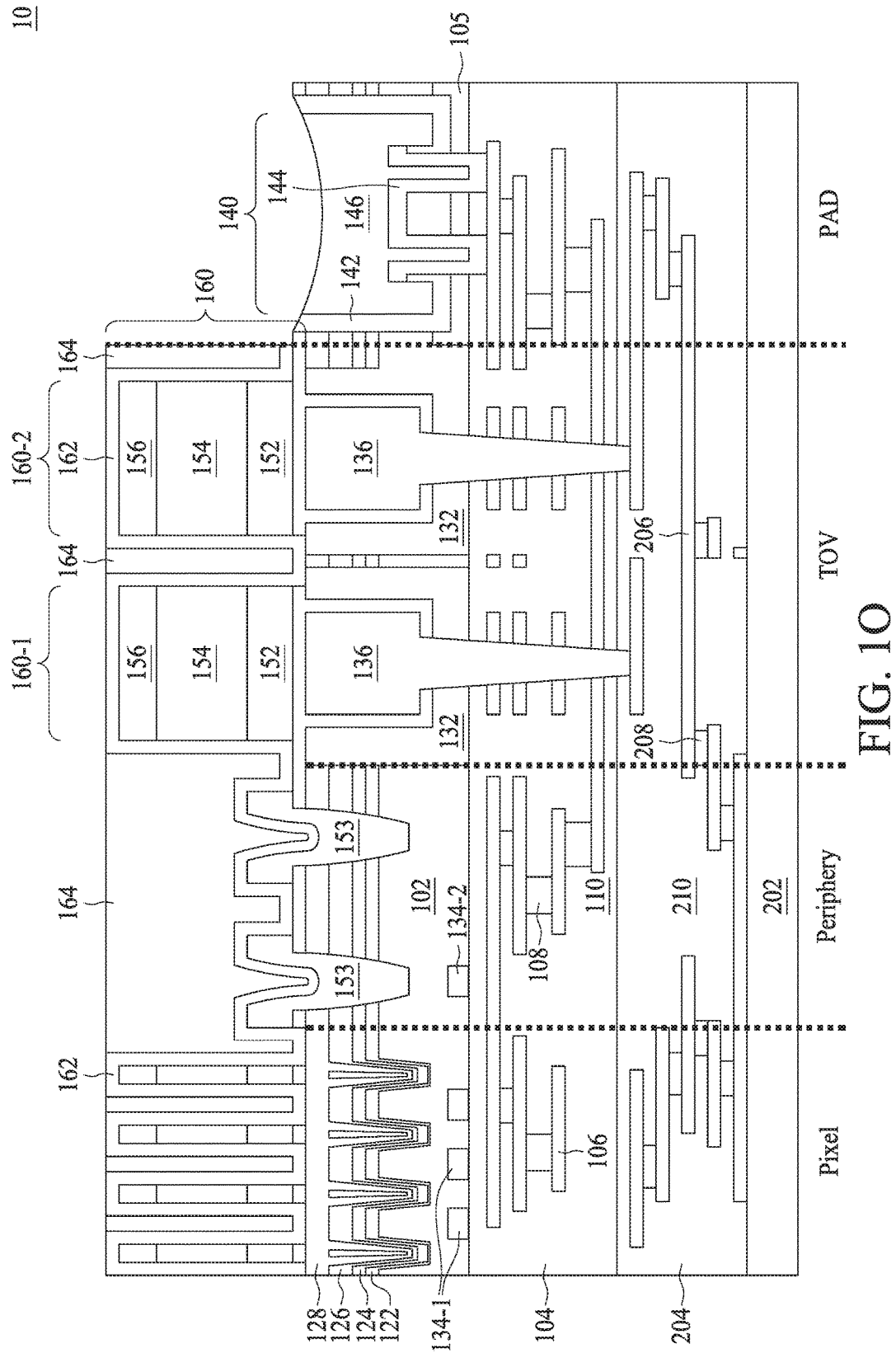

FIGS. 1M through 1O illustrate a forming of a composite capping structure 160. Referring to FIG. 1M, a conductive layer 152 is blanket deposited over the image sensor device 10. In some embodiments, the conductive layer 152 is configured as a cap for the underlying features such as the conductive vias 136. In some embodiments, the conductive layer 152 is configured to protect the conductive vias 136 from being damaged during a gate formation operation in a later step. In some embodiments, the conductive layer 152 is configured at a ground reference voltage level to maintain its electrical performance. In some embodiments, the conductive layer 152 is coupled to a ground terminal situated external to the "TOV" area. The conductive layer 152 may include copper, tungsten, aluminum, silver, combinations thereof, or the like. In some embodiments, an interfacial layer, such as Ti, Ta, TiN, or TaN, may be formed as a seed layer prior to the forming of the conductive layer 152. In some embodiments, the conductive layer 152 may be formed with a thickness of between about 1000 Å and about 3000 Å, for example, 2000 Å.

In some embodiments, a grounding terminal 153 is formed in the "periphery" area. At least one recess is formed which extends through the second buffer layer 138, through the dielectric layers 122, 124, 126 and 128, and into the first substrate 102. In some embodiments, the conductive material of the conductive layer 152 also fills the recess for forming the grounding terminal 153. In some embodiments, the conductive layer 152 is electrically coupled to the grounding terminal 153. In some embodiments, the conductive layer 152 further extends over the image sensing regions 134-1 in the "pixel" area.

Subsequently, a first protective layer 154 and a second protective layer 156 are sequentially formed over the conductive layer 152. The first protective layer 154 and the second protective layer 156 may comprise dielectric materials, such as silicon oxide, silicon nitride, silicon oxynitride, or the like. In some embodiments, the first protective layer 154 and the second protective layer 156 may have different materials and thicknesses. For example, the first protective layer 154 may include silicon oxide and the second protective layer 156 may include silicon nitride. In some embodiments, the first protective layer 154 has a thickness of between about 100 Å and about 10000 Å, e.g., 3000 Å. In some embodiments, the second protective layer 156 has a thickness of between about 200 Å and about 2000 Å, e.g., 500 Å. The first protective layer 154 and the second protective layer 156 may be formed through suitable operations such as thermal oxidation, CVD, PECVD, PVD, ALD, or the like.

Referring to FIG. 1N, the composite capping structure 160 is partitioned into an array or a grid of capping pads (e.g., portions 160-1 and 160-2) through a patterning operation. The patterning operation cuts through the conductive layer 152, the first protective layer 154, and the second protective layer 156. In some embodiments, a portion of the second buffer layer 138 between adjacent conductive vias 136 is exposed by the patterning operation. In some embodiments, the patterning operation removes the second buffer layer 138 between the conductive vias 136 and uncovers a portion of the dielectric layer 128 or the first buffer layer 132. In some embodiments, the patterning operation removes a depth of the dielectric layer 128 or the first buffer layer 132 such that the dielectric layer 128 or the first buffer layer 132 is recessed. In some embodiments, the patterning operation reshapes the composite capping structure 160 in the "TOV" area into physically isolated capping portions, e.g., 160-1 and 160-2, such that the isolated capping portions 106-1 and 160-2 cover corresponding conductive vias, e.g., 136-1 and 136-2. Furthermore, the conductive layer 152 is also partitioned into several electrically isolated conductors in the capping portions, e.g., 160-1 and 160-2. In some embodiments, the electrically isolated conductors 152 are arranged as a grid. In some embodiments, each electrically isolated capping portion 160-1 or 160-2 has a width greater than a width of the corresponding conductive via 136-1 or 136-2. In some embodiments, each electrically isolated capping portion 160-1 or 160-2 has an upper surface with an area greater than an area of an upper surface of the corresponding conductive via 136-1 or 136-2.

In some embodiments, the patterning operation removes undesired portions of the conductive layer 152 outside of the grounding terminal 153 in the "periphery" area. In some embodiments, the conductive material 152 extends over the reference image sensing region 134-2 to block light from entering the reference image sensing region 134-2. In some embodiments, a conductive path (not separately shown), e.g., a conductive trace or routing, is formed during the patterning operation to electrically couple the grounding terminal 153 with the conductive layer 152 in the "TOV" area. In some embodiments, the patterning operation removes portions of the conductive material covering the active image sensing regions 134-1 in the "pixel" area. Spaces directly above the active image sensing regions 134-1 can be cleared and the active image sensing regions 134-1 can receive incident radiation without interference. In some embodiments, the composite capping structure 160 is configured to align with the shield structure 107 in the "pixel" area.

As discussed previously, each of the conductive vias 136 usually has a length greater than that of the conductive via 108 or 208. Moreover, the conductive vias 136 are usually formed with a relatively large width from a top view. In some embodiments, each of the conductive vias 136 has a width greater than that of the conductive via 108 or 208. As discussed in descriptions with reference to FIG. 1J, a planarization operation is performed on the conductive vias 136. A high degree of planarity on an upper surface 136A of the conductive vias 136 is required in order to ensure reliable contact with the second buffer layer 138. However, the performance of the planarization operation is dependent on several factors, such as the width (or an equivalent surface area) of the conductive via 136. A relatively large area of the upper surface 136A may sometimes make it more difficult to achieve a desirable surface planarity, and thus the second buffered layer 138 may be deposited unsuccessfully over the uneven upper surface 136A. For example, a void or gap may be left inside the second buffer layer 138 or formed at the interface between the second buffer layer 138 and the conductive via 136. As a consequence, a short circuit between the conductive via 136 and the conductors 152 may occur due to the defective second buffer layer 138. In addition, two or more short circuits at the interfaces of different conductive via 136 and the conductive layer 152 may lead to a conductive path among those conductive vias 136. The electrical performance of the conductive vias 136 is reduced accordingly by such undesired short circuit effect.

In the present disclosure, the conductive layer 152 is configured as electrically isolated conductors 152. Consequently, the short circuit effect occurring within a single defective capping pad 160 may prevent a signal from propagating across the entire area of the conductive vias, i.e., the "TOV" area. In some embodiments, the conductive layer 152 is further configured as a grid of physically isolated pads 160 to ensure electrical isolation among conductive vias 136. The electrical performance of the image sensor device 10 can thereby be improved.

A protective dielectric 162 is conformally deposited over the patterned composite capping structure 160 as illustrated in FIG. 1O. The protective dielectric 162 covers a top surface and sidewalls of the individual capping pads 160-1 and 160-2. In some embodiments, the protective dielectric 162 covers the composite capping structure 160 in the "periphery" area and in the "pixel" area. The protective dielectric 162 may be formed of silicon oxide, silicon nitride, silicon oxynitride, or the like. Additionally, in some embodiments, spaces among the isolated capping pads 160-1 and 160-2 are filled with a filling dielectric 164. In some embodiments, the filling dielectric 164 also fills spaces of the composite capping structure 160 in the "periphery" area and in the "pixel" area while exposing the bond pad structure 140. In some embodiments, spaces in the composite capping structure 160 within the "pixel" area are not filled with the filling dielectric 164. The filling dielectric 164 may be formed of silicon oxide, silicon nitride, silicon oxynitride, or the like. In some embodiments, the filling dielectric 164 includes a polymeric material selected from a group consisting of polyimide (PI), polybenzoxazole (PBO), benzocyclobuten (BCB), epoxy, and the like.

Figure 2A:
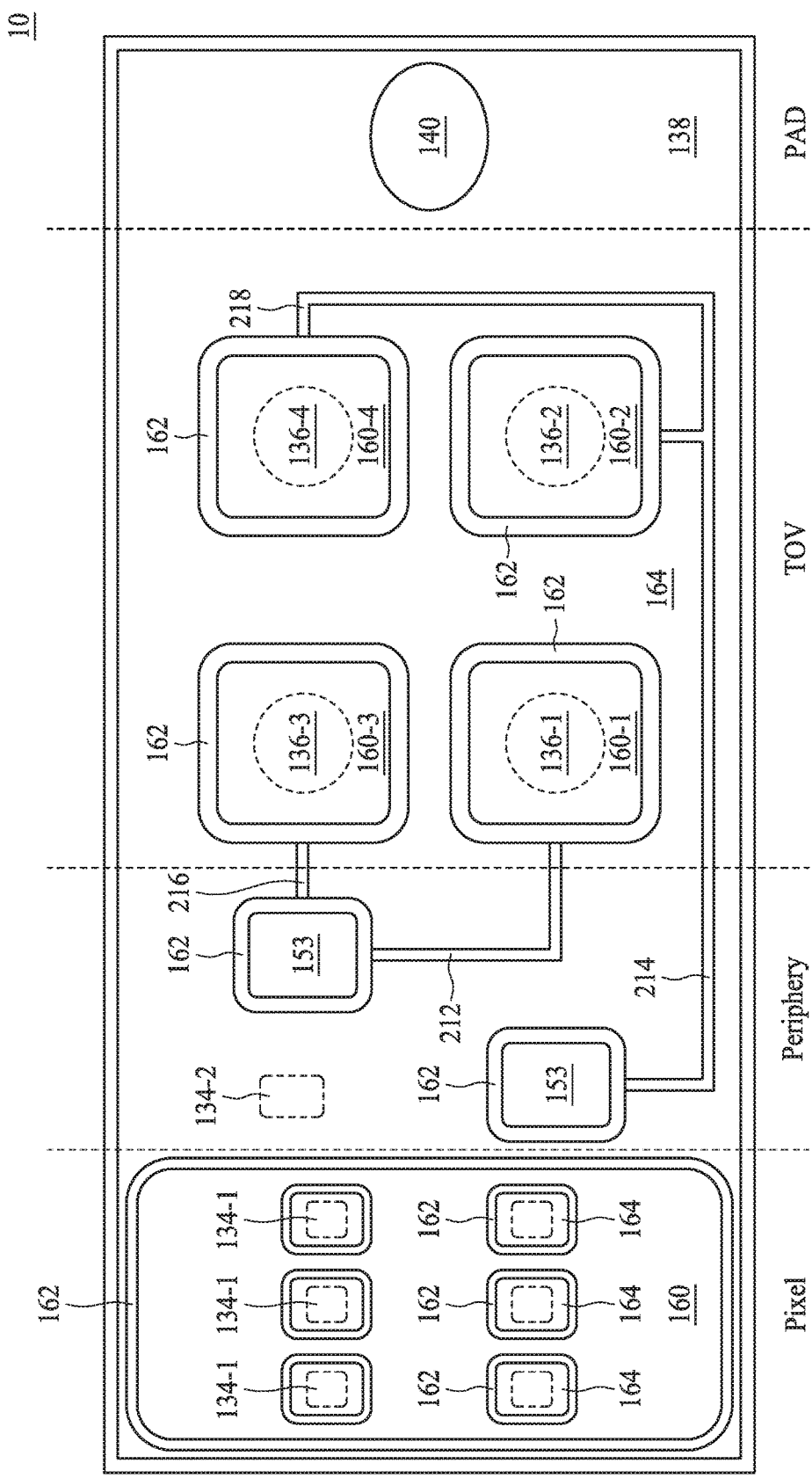
FIG. 2A is a schematic top view of an image sensor device, in accordance with some embodiments.

FIG. 2A is a schematic top view of the image sensor device 10, in accordance with some embodiments. Referring to FIG. 2A, the composite capping structure 160 within the "TOV" area includes four capping pads 160-1 through 160-4 arranged in a 2×2 grid, and each pad covers a corresponding conductive via 136-1 through 136-4. The conductive vias 136 are illustrated with dashed lines to represent that they are arranged one layer below the second buffer layer 138. Additionally, component layers of each of the capping pads 160 (illustrated in FIG. 1O) are not shown in FIG. 2A for simplicity. As can be seen by comparing FIG. 1O and FIG. 2A, sidewalls of each of the capping pads 160-1 through 160-4 are covered by the protective dielectric 162. Also, spaces between the capping pads 160-1 through 160-4 are filled with the filling dielectric 164. In the present embodiment, the capping pad includes a rectangular shape. However, other shapes are also possible, such as a circular shape, an oval shape, a square shape, a polygonal shape, and the like.

Two grounding terminals 153 and the reference image sensing region 134-2 are shown in the "periphery" area. In some embodiments, the filling dielectric 164 covers the portion of the dielectric 162 in the "periphery" area as illustrated in FIG. 1O, while the protective dielectric 162 in the "TOV" area is not covered by the filling dielectric 164. In some embodiments, the capping pads 160-1 through 160-4 are electrically coupled to the grounding terminals 153 via the conductive paths 212, 214, 216 and 218, respectively. In some embodiments, the conductive paths 212 through 218 are formed of conductive materials, such as copper, tungsten, aluminum, silver, combinations thereof, or the like. The configuration of the conductive paths to couple the capping pads 160-1 through 160-4 to ground in the present embodiment is shown for illustration. Other implementations of wiring patterns or geometries are also possible.

Figure 2B:
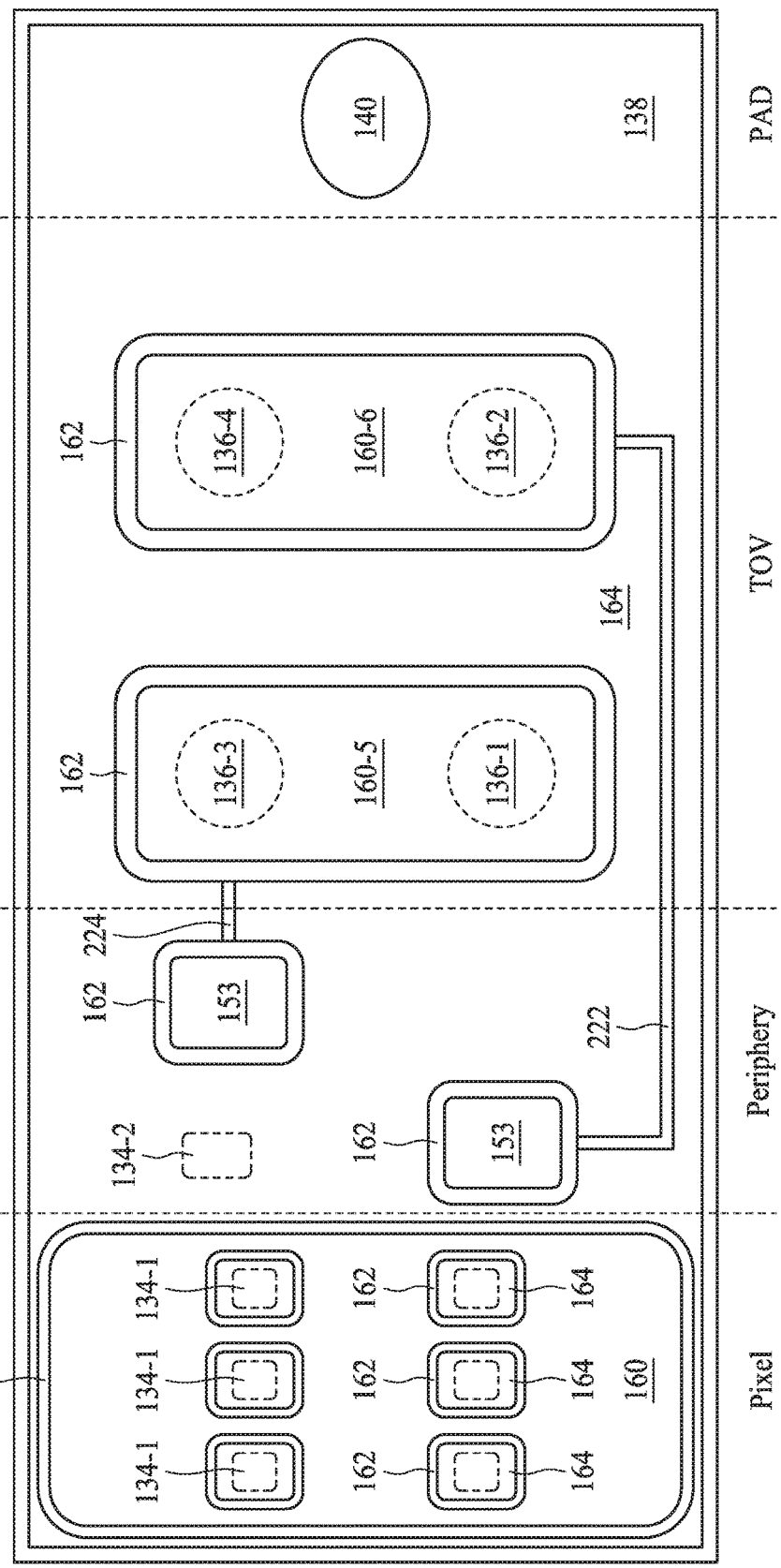
FIG. 2B is a schematic top view of an image sensor device, in accordance with some embodiments.

FIG. 2B is a schematic top view of an image sensor device, in accordance with some embodiments. Referring to FIG. 2A and FIG. 2B, the composite capping structure 160 in FIG. 2B is partitioned into individual strips each covering multiple conductive vias 136. For example, the capping strip 160-5 covers the conductive vias 136-1 and 136-3, and the capping strip 160-6 covers the conductive vias 136-2 and 136-4. As such, the conductors 152 (not shown in FIG. 2B) in the capping strip 160-5 or 160-6 would cover at least two conductive vias. In some embodiments, the grounding circuits are also adapted to the capping strip configurations. For example, only two conductive paths 222 and 224 are required to couple the conductors 152 in the capping strips 160-5 and 160-6 to ground.

The present disclosure provides a method of manufacturing an image sensor device. The method comprises forming a first semiconductor chip including a matrix of image sensing cells and bonding a second semiconductor chip with the first semiconductor chip. A plurality of conductive vias are formed in the second semiconductor chip, where each of the plurality of conductive vias includes a first end substantially coplanar with a first surface of the first semiconductor chip and a second end in contact with a conductive trace in the second semiconductor chip. A first dielectric layer is formed over the plurality of conductive vias and a first conductive material is formed over the first dielectric layer. The first conductive material is etched to form a plurality of conductors coupled to ground and the plurality of conductors are electrically isolated from one another.

The present disclosure provides a method of manufacturing an image sensor device. An image sensing region is formed in a first substrate. An interconnect layer is formed over the first substrate. A semiconductor chip is bonded with the interconnect layer and an array of vias are formed in the interconnect layer, where each via extends from the first substrate to the semiconductor chip. An array of conductors are formed which substantially follow the pattern of the array of vias, where the conductors are electrically isolated from one another.

The present disclosure provides a semiconductor device. The semiconductor device includes a first semiconductor chip including a matrix of image sensing cells. The semiconductor device also includes a second semiconductor chip bonded to the first semiconductor chip. The semiconductor device further includes a plurality of conductive vias, where each conductive via includes a first end substantially coplanar with a first surface of the first semiconductor chip and a second end in contact with a conductive trace in the second semiconductor chip. Additionally, the semiconductor device includes a dielectric layer over the plurality of conductive vias, and a plurality of conductors coupled to ground and disposed over the dielectric layer. Each of the plurality of conductors is electrically isolated from the others.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing an image sensor device, the method comprising:
    forming a first semiconductor chip including a matrix of image sensing cells;
    bonding a second semiconductor chip with the first semiconductor chip;
    forming a plurality of conductive vias in the first semiconductor chip, each of the plurality of conductive vias including a first end substantially coplanar with a first surface of the first semiconductor chip and a second end in contact with a conductive trace in the second semiconductor chip;
    forming a first dielectric layer over the plurality of conductive vias;
    forming a first conductive material over the first dielectric layer; and
    etching the first conductive material to form a plurality of conductors coupled to ground, the plurality of conductors being electrically isolated from one another and each of the plurality of conductors covering a corresponding one of the plurality of conductive vias.

2. The method according to claim 1, further comprising filling spaces between the electrically isolated conductors with a dielectric material.

3. The method according to claim 2, wherein etching the first conductive material to form a plurality of conductors comprises depositing a protective layer over the first conductive material and etching the first conductive material and the protective layer through a single patterning operation.

4. The method according to claim 3, wherein forming a first conductive material over the first dielectric layer further comprises forming the first conductive material over the image sensing cells, and the single patterning operation further removes the conductive material covering the image sensing cells.

5. The method according to claim 1, further comprising forming a bond pad structure in the first semiconductor chip adjacent to the plurality of conductive vias.

6. The method according to claim 1, wherein forming a first semiconductor chip further comprises forming an interconnect layer comprising an inter-metal dielectric (IMD) on a first substrate, wherein forming a plurality of conductive vias comprises forming first recesses through the first substrate and the IMD, each of the first recesses exposing an upper surface of the interconnect layer.

7. The method according to claim 6, wherein the forming a plurality of conductive vias in the first semiconductor chip further comprises:
forming a second recess in the first semiconductor chip under each of the first recesses, the second recesses having a width less than the first recesses and at least one of the second recesses reaching a portion of the conductive trace; and
filling the first recesses and the second recesses with a second conductive material.

8. The method according to claim 7, further comprising, before forming the second recesses and filling the second conductive material, depositing a buffer layer onto a bottom and a sidewall of each of the first recesses.

9. The method according to claim 8, wherein each of the first recesses comprises a substantially uniform width across the sidewall where the buffer layer is deposited.

10. The method according to claim 1, wherein etching the first conductive material to form a plurality of conductors coupled to ground comprises forming a ground terminal adjacent to the plurality of vias and electrically coupling the ground terminal with at least one of the plurality of conductors.

11. A method of manufacturing an image sensor device, the method comprising:
forming an image sensing region in a first substrate;
forming an interconnect layer over the first substrate;
bonding a semiconductor chip with the interconnect layer;
forming an array of vias in the interconnect layer, each via extending from the first substrate to the semiconductor chip;
forming a recess in the first substrate in an area adjacent to the image sensing region and forming a ground terminal in the recess; and
forming an array of conductors substantially following the pattern of the array of vias, wherein the conductors are electrically isolated from one another and each of the conductors covers a corresponding one of the vias.

12. The method according to claim 11, further comprising forming a dielectric layer covering the array of vias.

13. The method according to claim 11, wherein the electrically isolated conductors are separated from one another by spaces, and the method further comprises conformally depositing a dielectric material covering a sidewall of each of the conductors.

14. The method according to claim 11, further comprising forming a layered dielectric structure over the first substrate, the layered dielectric structure covering the image sensing region and surrounding each of the vias laterally.

15. The method according to claim 14, wherein forming an array of conductors substantially following the pattern of the array of vias comprises sequentially depositing a blanket conductive layer and a blanket dielectric material over the first substrate and patterning the conductive layer and the dielectric material.

16. The method according to claim 11, further comprising, prior to forming an array of conductors substantially following the pattern of the array of vias, forming a dielectric layer over the array of vias, the dielectric layer electrically insulating the array of vias from the array of conductors.

17. A method of manufacturing an image sensor device, the method comprising:
bonding a first substrate with a first semiconductor chip having an interconnect layer, the first substrate comprising a second semiconductor chip;
forming an array of conductive vias through the interconnect layer;
forming a recess in the first semiconductor chip adjacent to the array of conductive vias and forming a ground terminal in the recess; and
patterning a conductive material into an array of conductors covering the array of conductive vias, wherein the array conductors comprises at least one first conductor and at least one second conductor, the at least one first conductor and the at least one second conductor being electrically isolated from each other, and each of the conductors covers a corresponding one of the vias.

18. The method according to claim 17, further comprising forming a ground terminal coupled to the array of conductors.

19. The method according to claim 17, wherein forming an array of conductive vias further comprises forming the conductive vias to electrically couple to the second semiconductor chip in the first substrate.

20. The method according to claim 17, wherein each of the conductive vias comprises a first portion within the interconnect layer and a second portion over the interconnect layer, and the second portion comprises a first width greater than a second width of the first portion.

* * * * *